(12) United States Patent
Shiikuma

(10) Patent No.: US 7,453,320 B2
(45) Date of Patent: Nov. 18, 2008

(54) AMPLIFIER

(75) Inventor: Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/572,065

(22) PCT Filed: Sep. 17, 2004

(86) PCT No.: PCT/JP2004/014038

§ 371 (c)(1),
(2), (4) Date: Nov. 6, 2006

(87) PCT Pub. No.: WO2005/029695

PCT Pub. Date: Mar. 31, 2005

(65) Prior Publication Data

US 2007/0103237 A1   May 10, 2007

(30) Foreign Application Priority Data

Sep. 17, 2003 (JP) .............................. 2003-323836

(51) Int. Cl.
*H03F 3/68* (2006.01)
(52) U.S. Cl. .................. 330/295; 330/124 R; 330/286; 330/310
(58) Field of Classification Search .............. 330/295, 330/124 R, 286, 310
See application file for complete search history.

(56) References Cited

U.S. PATENT DOCUMENTS

| | | | |
|---|---|---|---|
| 5,994,965 A | 11/1999 | Davis et al. | |
| 6,262,629 B1 | 7/2001 | Stengel et al. | |
| 6,794,933 B2* | 9/2004 | Gurvich et al. | ............... 330/52 |
| 6,853,244 B2* | 2/2005 | Robinson et al. | ............... 330/51 |
| 7,262,656 B2* | 8/2007 | Shiikuma | ................ 330/124 R |
| 2007/0164818 A1* | 7/2007 | Horiguchi et al. | ........ 330/124 R |

FOREIGN PATENT DOCUMENTS

| | | |
|---|---|---|
| JP | 10-513631 | 12/1998 |
| JP | 2000-323943 | 11/2000 |
| KR | 10-2005-0046731 | 5/2005 |
| WO | WO 2004/017512 A1 | 2/2004 |

OTHER PUBLICATIONS

Korean Office Action dated Jan. 16, 2007, with partial english language translation.

(Continued)

*Primary Examiner*—Patricia Nguyen
(74) *Attorney, Agent, or Firm*—McGinn IP Law Group, PLLC

(57) ABSTRACT

An amplifier comprises a carrier amplifier which performs signal amplification at all times, a peak amplifier which operates only at a time when the high electric power is outputted, a combiner which combines the output from the carrier amplifier and the peak amplifier, and a distributor which distributes an input signal to the carrier amplifier and the peak amplifier. The carrier amplifier and the peak amplifier are included in a single package transistor.

20 Claims, 3 Drawing Sheets

OTHER PUBLICATIONS

Yang, Youngoo, et al., "A Fully Matched N-way Doherty Amplifier with Optimized Linearity", IEEE Trans. MTT, vol. 51, No. 3, Mar. 2003.

Korean Office Action dated Jun. 12, 2007 with partial English Translation.

McCarroll C.P., et al., "A 20 GHz Doherty power amplifer MMIC with high efficiency and low distortion designed for broad band digital communication sytems", Microwave Symposium Digest, 2000 IEEE, MTT-S International Boston, MA, USA Jun. 11-16, 2000, Piscataway, NJ, USA IEEE, US, vol. 1, Jun. 11, 2000, pp. 537-540.

Campbell, C.F., "A Fully Integrated KU-Band Doherty Amplifier MMIC", IEEE Microwave and Guided Wave Letters, IEEE Inc., New York, US, vol. 9, No. 3, Mar. 1999, pp. 114-116.

European Search Report dated Jul. 3, 2007.

Japanese Office Action dated Feb. 20, 2008 with a partial English translation.

Doherty W.H., "A New High Efficiency Power Amplifier for Modulated Waves", 1936 Proc. of IRE, vol. 24, No. 9, pp. 1163-1182.

Cripps, Steve C., "Advanced Techniques in RF Power Amplifier Design" Artech House 2002, pp. 33-56.

* cited by examiner

AMPLIFIER

TECHNICAL FIELD

The present invention relates to an amplifier, and in particular, to an amplifier in which a liner amplifier and a non-linear amplifier are used together to perform amplification.

BACKGROUND ART

In a power amplifier for use in a radio communication system, linearity and high efficiency are required. Especially, in recent years, there is often handled a signal having an average value of signal amplitudes which is largely different from a maximum amplitude in a multi-valued digital modulation communicating system or the like. In a case where such signal is amplified with a conventional power amplifier, the amplifier is set to an operation point at which the signal can be amplified to the maximum amplitude without straining the signal. Therefore, there is little time when the amplifier operates in the vicinity of a saturated output in which a relatively high efficiency can be maintained. In general, the efficiency of the amplifier is low.

To solve this problem, various technologies have been developed in which the efficiency of the amplifier is improved while maintaining the linearity. One of them relates to the Doherty amplifier. A basic structure of the Doherty amplifier is already known to a person skilled in the art (refer to "A New High Efficiency Power Amplifier for Modulated Waves" authored by W. H. Doherty, 1936 Proc. of IRE, Vol. 24, No. 9, pp. 1163 to 1182 and "Advanced Techniques in RF Power Amplifier Design" authored by Steve C. Cripps, Artech House 2002, pp. 33 to 56).

Moreover, an expansion type Doherty amplifier described later is also known (refer to "A Fully Matched N-way Doherty Amplifier with Optimized Linearity" authored by Youngoo Yang, Jeonghyeon Cha, Bumjae Shin, and Bumman Kim, IEEE Trans. MTT, Vol. 51, No. 3, Mar. 2003).

The Doherty amplifier has an amplifier which operates while maintaining saturation in the vicinity of the saturated output power. Accordingly, an efficiency which is higher than that of a usual A-class or AB-class amplifier is realized even at a time when the saturated power backs off.

FIG. 4 is a structure diagram showing one example of the conventional Doherty amplifier.

The drawing schematically shows the amplifier described in Japanese Patent Application Publication No. 10-513631 (refer to abstract and FIG. 6).

Referring to the drawing, the conventional Doherty amplifier has: a carrier amplifier 21 that performs a signal amplifying operation at all times; a peak amplifier 22 (sometimes referred to as an "auxiliary amplifier", but unified as the "peak amplifier" in the present invention) that operates only at a time of the outputting of a high electric power; a combiner 23 that combines and outputs the outputs from the carrier amplifier 21 and the peak amplifier 22; and a distributor 24 that distributes an input signal to the carrier amplifier 21 and the peak amplifier 22. The carrier amplifier 21 is included in a single package 25, and the peak amplifier 22 is included in a different package 26.

In the carrier amplifier 21, an amplifier biased in the AB-class or a B-class is normally used. The peak amplifier 22 is usually biased and used in a C-class so as to operate only when the signal electric power is a high output. The combiner 23 which combines the outputs of the carrier amplifier 21 and the peak amplifier 22 is structured by a transformer, an impedance converter and the like. The combiner is usually structured by a ¼ wavelength transmission line in a case where a signal having a microwave band is handled. The input distributor 24 is structured by a ¼ wavelength transmission line, a 90° hybrid circuit or the like in order to set a phase relation between the output signals of the peak amplifier 22 and the carrier amplifier 21 so that the signals are combined in the same phase at a signal combining point of the combiner 23.

As described above, the carrier amplifier 21 and the peak amplifier 22 which are constituting elements of such Doherty amplifier have been structured by using amplification elements (1 package transistor) which have been heretofore separately packaged.

As one example, the carrier amplifier 21 and the peak amplifier 22 have been structured by using two MOS type FET semiconductor elements each of which is MRFI 83 (field effect transistor of Motorola, Inc.).

With such a structure, since the transistors stored in the separate packages are used in the respective amplifiers, an area for mounting two packages of transistors is required. This has been disadvantageous in advancing miniaturization of a device.

Moreover, since two amplifiers are separately disposed, the transmission line lengthens which extends from each amplifier output to the signal combining point, transmission losses increases, and the efficiency of the whole amplifier is lowered. The structure is also disadvantageous in reducing costs of the device.

Furthermore, in the linear amplifier of A-class, AB-class, B-class or the like structured as a push-pull amplifier or a balance amplifier, there is little time when the electric power amplifier operates in the vicinity of the saturated output in which the relatively high efficiency can be maintained as described above. Therefore, in general, the efficiency is low, and there has been a demand for an electric power amplifier which operates with a higher efficiency.

It is therefore an object of the present invention to provide an amplifier which can achieve miniaturization of a device, reduction of transmission losses, and improvement of an efficiency.

DISCLOSURE OF THE INVENTION

To solve the above-described problem, the present invention is an amplifier comprising: a distributor which distributes input signals to two amplifiers; one or a plurality of linear amplifiers into which one signal from the distributor is input; one or a plurality of nonlinear amplifiers into which the other signal from the distributor is input; and a combiner which combines output signals from the linear amplifier and the nonlinear amplifier, wherein among a plurality of transistors included in a package, each of the predetermined number of the transistors is used as the linear amplifier, and each of the other transistors is used as the nonlinear amplifier.

Heretofore, there has been a package containing two transistors for a push-pull amplifier or a balance amplifier, but in the present invention, one transistor in this package is operated as the linear amplifier (carrier amplifier), and the other transistor is operated as the nonlinear amplifier (peak amplifier). Thus, the Doherty amplifier structured by a single package is realized.

BEST MODE FOR CARRYING OUT THE INVENTION

Figure 1:
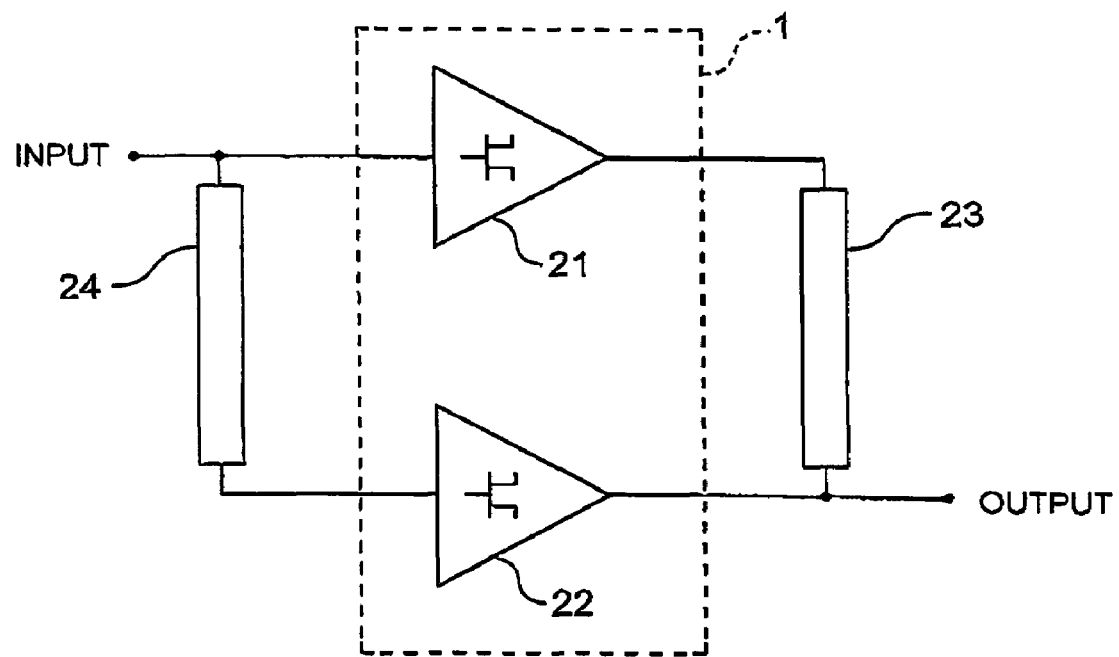
FIG. 1 is a constitution diagram showing an example of an amplifier of the present invention.

An embodiment of the present invention will be described hereinafter with reference to the accompanying drawings. FIG. 1 is a constitution diagram showing an example of an amplifier of the present invention.

Referring to the drawing, the amplifier of the present invention has: a carrier amplifier 21 that performs a signal amplifying operation at all times; a peak amplifier 22 that operates only at a time of the outputting of a high electric power; a combiner 23 that combines and outputs the outputs from the carrier amplifier 21 and the peak amplifier 22; and a distributor 24 that distributes an input signal to the carrier amplifier 21 and the peak amplifier 22. The carrier amplifier 21 and the peak amplifier 22 are included in a single package 1 (a single package transistor). This amplifier amplifies a signal to be amplified input from an input end.

In the carrier amplifier 21, an amplifier biased in an AB-class or a B-class is usually used. Moreover, the peak amplifier 22 is usually biased and used in a C-class so as to operate only when the signal electric power is a high output. The combiner 23 which combines the outputs of the carrier amplifier 21 and the peak amplifier 22 is structured by a transformer, an impedance converter and or like. The combiner is usually structured by a ¼ wavelength transmission line in a case where a signal having a microwave band is handled. The input distributor 24 is structured by a ¼ wavelength transmission line, a 90° hybrid circuit and the like in order to set a phase relation between the output signals of the peak amplifier 22 and the carrier amplifier 21 so that the signals are combined in the same phase at a signal combining point of the combiner 23.

It is to be noted that in FIG. 1, a symbol of a field effect transistor is shown as the transistor, but the transistor is not limited to this field effect transistor, and the transistor can be structured by another element having an equivalent function, such as a bipolar transistor. Another example of the distributor 24, the combiner 23 or the like of the above-described embodiment is well known, but the example is not directly related with the present invention, and therefore detailed description thereof is omitted.

In the conventional Doherty amplifier, the carrier amplifier and the peak amplifier have been structured by transistors included in separate packages. On the other hand, according to the present invention, since the equivalent amplifier can be structured by the transistor included in the single package, miniaturization of a mounting area or cost reduction can be achieved in a case where the Doherty amplifier having an equivalent saturated output is structured.

Moreover, as well known, the Doherty amplifier has an effect that a high efficiency is obtained as compared with the usual linear amplifier of the A-class, AB-class or the like. Therefore, as compared with a case where the linear amplifier of the A-class, AB-class, B-class or the like is structured as the push-pull amplifier or the balance amplifier, in the Doherty amplifier of the present invention, a high-efficiency amplifier having the equivalent performance can be also obtained without being enlarged.

Next, an operation of the embodiment of the present invention will be described by use of a concrete example.

Here, as an example, it is supposed that an amplifier having a saturated output of 180 W in a 2 GHz band is structured by a general Doherty amplifier. With the conventional structure, it is general to use elements having an equal output in the carrier amplifier and the peak amplifier, that is, a constitution is used in which an output of each amplifier is set to 90 W, and an output of 180 W is obtained from the Doherty amplifier.

In this case, as a preferable element, an element is selected in which MRF 21090 of Motorola, Inc. which is a specific transistor having an output of 90 W is stored as a field effect transistor in a package. This is one of considerably miniaturized products among the transistors having the equal output at a time of when the application of the present invention was filed as far as the present inventor knows.

Figure 2:
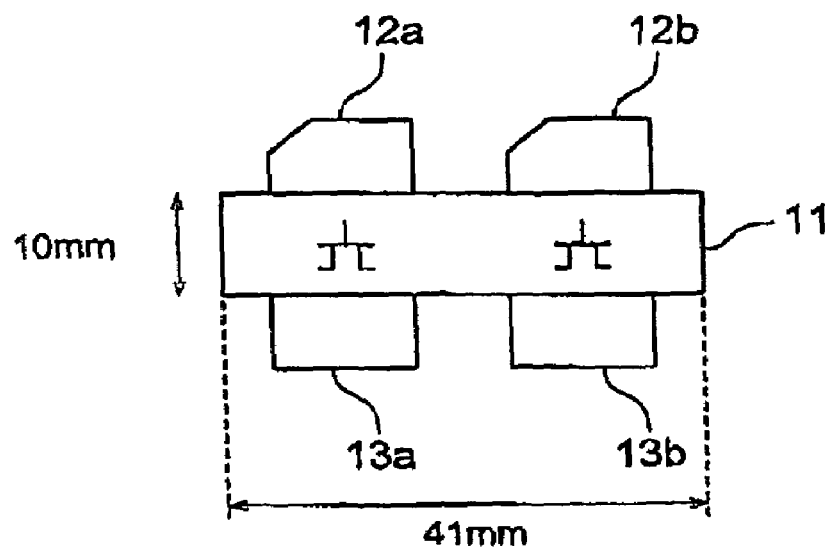
FIG. 2 is an appearance diagram of a field effect transistor (MRF5P21180)
Figure 3:
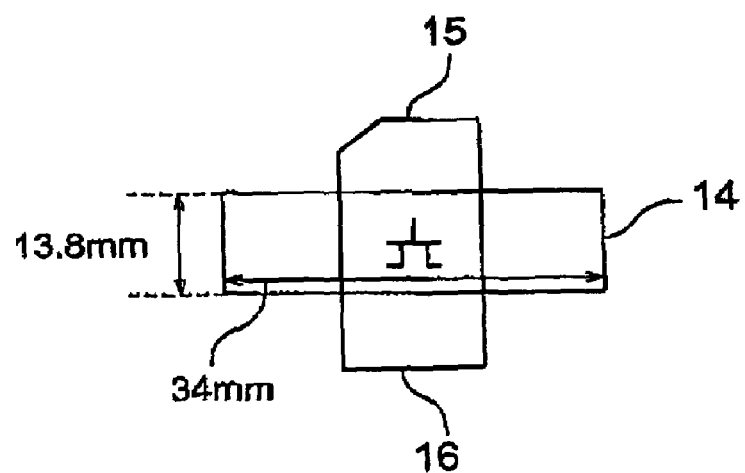
FIG. 3 is an appearance diagram of a field effect transistor (MRF21090)
Figure 4:
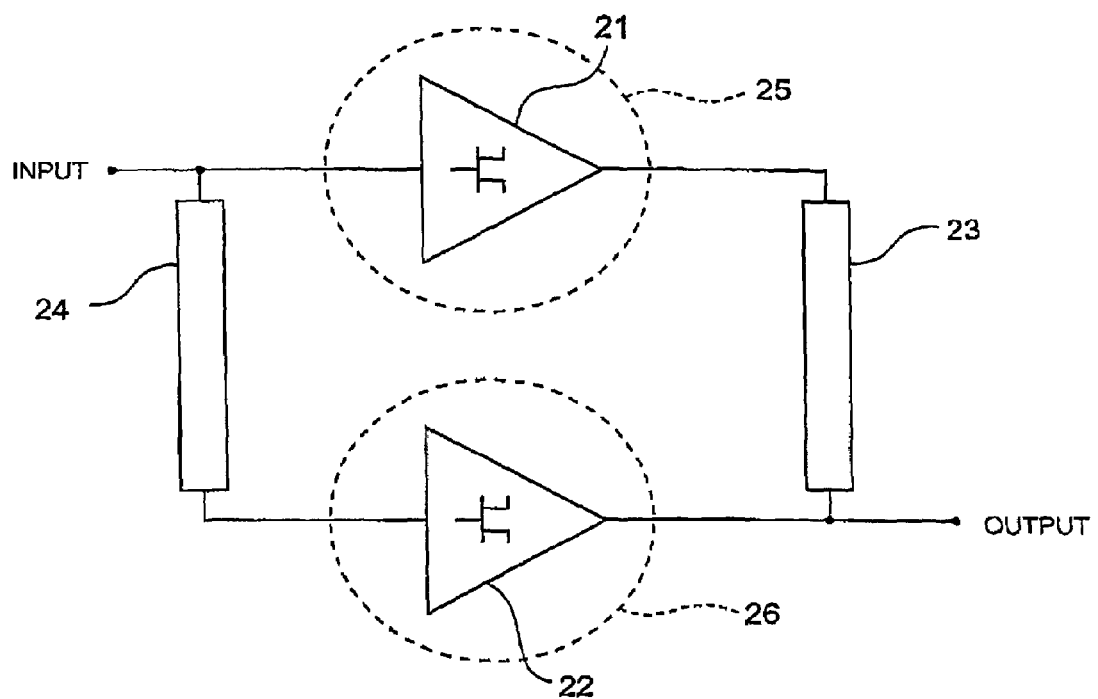
FIG. 4 is a constitution diagram showing an example of the conventional Doherty amplifier.

FIG. 2 is an appearance diagram of a field effect transistor (MRF5P21180), and FIG. 3 is an appearance diagram of a field effect transistor (MRF21090).

FIG. 2 shows the field effect transistor having two gate electrodes 12a, 12b and two drain electrodes 13a, 13b in a package (flange) 11. FIG. 3 shows the field effect transistor having a gate electrode 15 and a drain electrode 16 in a package (flange) 14.

As to an outer shape of the field effect transistor (MRF21090) excluding an electrode portion shown in FIG. 3, an outer shape dimension is about 34 mm×13.8 mm per transistor, and a dimension of about 9.4 square centimeters for two transistors at minimum is required as a transistor portion mounting area.

On the other hand, according to the present invention, it is assumed that the 180 W Doherty amplifier is structured by a field effect transistor in a single package. It is assumed that a transistor MRF5P21180 of Motorola Inc. is similarly adopted as a 180 W output device including two transistors in the single package for push-pull (refer to FIG. 2).

In this case, as shown in the drawing, an outer shape dimension excluding the electrode portion of the transistor is about 41 mm×10 mm, and a mounting area is about 4.1 square centimeters. Even in the transistor portion only, the area is reduced to 43% or less as compared with a conventional structure, and thus miniaturized Doherty amplifier can be structured. The area even including a peripheral circuit and the like can be reduced to an approximate half of the area of the conventional constitution.

Since the circuit mounting area can be reduced in this manner, it is possible to reduce a line length of a circuit which especially combines the outputs of the carrier amplifier and the peak amplifier. That is, transmission losses of signals can be reduced. As a result, an efficiency of the Doherty amplifier can be improved.

For example, in a case where the amplifier is structured in an approximate half area in the above-described typical example, it is possible to sufficiently reduce the transmission line length by about 70% ($1/\sqrt{2}$), and the corresponding losses can be reduced. For example, in the above-described typical example, it is possible to cut a line length of about 20 mm in the 2 GHz band. This corresponds to reduction of the transmission losses by about 0.1 dB (2%) in a general glass epoxy substrate. Especially in a case where an amplifier output of an electric power of 180 W is to be obtained, a loss of about 4 W can be reduced.

Moreover, even as compared with a case where the same 180 W amplifier is structured by a general push-pull or balance type linear amplifier of the A-class, B-class or the like, the same element is used as the Doherty amplifier in the present invention. Therefore, it is possible to largely improve the efficiency of the amplifier.

Next, another embodiment will be described.

A basic structure of another embodiment of the present invention is the same as described above, but the so-called expansion type Doherty amplifier may be structured by using three or more transistors stored in a single package. In the amplifier, an electric power is not equally distributed to a peak amplifier and a carrier amplifier. As an example of a method of structuring the expansion type Doherty amplifier, the Doherty amplifier is structured by N carrier and peak amplifiers in total is described in the above-described document (Youngoo Yang) and the like. Needless to say, the present invention can be easily applied to such expansion type Doherty amplifier. Furthermore, it is apparent that the present invention can be easily applied to a modification of the Doherty amplifier or the like structured by multistage peak or carrier amplifiers.

INDUSTRIAL APPLICABILITY

According to the present invention, since a carrier amplifier and a peak amplifier are structured by transistors in a single package, the Doherty amplifier can be miniaturized.

Moreover, since the carrier amplifier and the peak amplifier are structured by the transistors In the single package, and miniaturized, it is possible to reduce transmission losses of a circuit that combines outputs of the carrier amplifier and the peak amplifier, and the efficiency of the amplifier is improved.

Furthermore, since the Doherty amplifier is structured by the transistors in the single package, the efficiency can be improved as compared with a case where the conventional A-class or AB-class amplifier is structured by the same transistors in the single package.

The invention claimed is:

1. An amplifier, comprising:
   a distributor which distributes input signals to two amplifiers;
   one or a plurality of linear amplifiers into which one signal from the distributor is input;
   one or a plurality of nonlinear amplifiers into which the other signal from the distributor is input; and
   a combiner that combines output signals from the linear amplifier and the nonlinear amplifier,
   wherein among a plurality of transistors included in a package, each of a predetermined number of the transistors comprises the linear amplifier, and each of the other transistors comprises the nonlinear amplifier, and
   wherein the package is directly connected to at least a gate electrode and a drain electrode.

2. The amplifier according to claim 1, wherein: the linear amplifier comprises a carrier amplifier, and the nonlinear amplifier comprises a peak amplifier.

3. The amplifier according to claim 1, wherein: each of the linear amplifier and the nonlinear amplifier comprises an amplifier, one of two transistors included in the package comprises the linear amplifier, and the other transistor comprises the nonlinear amplifier.

4. The amplifier according to claim 1, wherein: the transistor included in the package funtions as push-pull amplifier or a balance amplifier.

5. The amplifier according to claim 1, wherein: the distributor sets a phase relation between the linear amplifier and the nonlinear amplifier so that the signals are combined in the same phase at a signal combining point of the combiner.

6. The amplifier according to claim 1, wherein: the distributor comprises a ¼ wavelength transmission line or a 90° hybrid circuit.

7. The amplifier according to claim 1, wherein: the combiner comprises any of a transformer, an impedance converter, and a ¼ wavelength transmission line.

8. The amplifier according to claim 1, which comprises comprises a Doherty amplifier.

9. The amplifier according to claim 2, wherein: each of the linear amplifier and the nonlinear amplifier comprises an amplifier, one of two transistors included in the package comprises the linear amplifier, and the other transistor comprises the nonlinear amplifier.

10. The amplifier according to claim 2, wherein: the transistor included in the package functions as a push-pull amplifier or a balance amplifier.

11. The amplifier according to claim 2, wherein: the distributor sets a phase relation between the linear amplifier and the nonlinear amplifier so that the signals are combined in the same phase at a signal combining point of the combiner.

12. The amplifier according to claim 2, wherein: the distributor comprises a ¼ wavelength transmission line or a 90° hybrid circuit.

13. The amplifier according to claim 2, wherein: the combiner comprises any of a transformer, an impedance converter, and a ¼ wavelength transmission line.

14. The amplifier according to claim 2, further comprises Doherty amplifier.

15. The amplifier according to claim 3, wherein: the transistor included in the package functions as a push-pull amplifier or a balance amplifier.

16. The amplifier according to claim 3, wherein: the distributor sets a phase relation between the linear amplifier and the nonlinear amplifier so that the signals are combined in the same phase at a signal combining point of the combiner.

17. The amplifier according to claim 3 wherein: the distributor comprises a ¼ wavelength transmission line or a 90° hybrid circuit.

18. The amplifier according to claim 3, wherein: the combiner comprises any of a transformer, an impedance converter, and a ¼ wavelength transmission line.

19. The amplifier according to claim 3, further comprising a Doherty amplifier.

20. The amplifier according to claim 4, wherein: the distributor sets a phase relation between the linear amplifier and the nonlinear amplifier so that the signals are combined in the same phase at a signal combining point of the combiner.

* * * * *